(12) United States Patent
Jeong et al.

(10) Patent No.: US 8,793,898 B2
(45) Date of Patent: Aug. 5, 2014

(54) APPARATUS AND METHOD FOR DRYING SUBSTRATES

(75) Inventors: Young-Ju Jeong, Chungcheongnam-do (KR); Bok-Kyu Lee, Chungcheongnam-do (KR); Sun-Kyu Hwang, Chungcheongnam-do (KR); Jeong-Yong Bae, Chungcheongnam-do (KR); Soo-Bin Yong, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 712 days.

(21) Appl. No.: 12/600,550

(22) PCT Filed: May 22, 2008

(86) PCT No.: PCT/KR2008/002875
§ 371 (c)(1),
(2), (4) Date: Nov. 17, 2009

(87) PCT Pub. No.: WO2008/143476
PCT Pub. Date: Nov. 27, 2008

(65) Prior Publication Data
US 2010/0146813 A1    Jun. 17, 2010

(30) Foreign Application Priority Data
May 23, 2007 (KR) .................. 10-2007-0050356
Mar. 11, 2008 (KR) .................. 10-2008-0022470

(51) Int. Cl.
*F26B 3/00* (2006.01)
(52) U.S. Cl.
USPC ............... 34/351; 34/312; 34/357; 34/381; 34/516; 134/32; 134/33; 134/34; 134/36

(58) Field of Classification Search
CPC ........................................ F26B 3/00
USPC ........... 34/312, 329, 343, 348, 350, 351, 357, 34/380, 381, 516; 134/32, 33, 34, 36
See application file for complete search history.

(56) References Cited

U.S. PATENT DOCUMENTS 6,276,378 B1    8/2001    Taniyama et al.
6,907,890 B2 *  6/2005    Myland ................ 134/25.1
(Continued)

FOREIGN PATENT DOCUMENTS

JP    04-263426    9/1992
JP    05-243205    9/1993
(Continued)

OTHER PUBLICATIONS

International Search Report for Appln. No. PCT/KR2008/002875 dated Oct. 29, 2008.

*Primary Examiner* — Jiping Lu
(74) *Attorney, Agent, or Firm* — Carter, DeLuca, Farrell & Schmidt, LLP

(57) ABSTRACT

A method for drying substrates using isopropyl alcohol (IPA) includes: a pre-stage in which heated fluid is injected to a bottom surface of a substrate to raise a temperature of the substrate simultaneously to injection of an organic solvent to a top surface of the substrate and injection of a dry gas to the top surface thereof to improve a vaporization power of the organic solvent; and a final stage in which the injection of the heated fluid is stopped and the organic solvent and the dry gas are injected to the top surface of the substrate.

16 Claims, 6 Drawing Sheets

(56) References Cited

U.S. PATENT DOCUMENTS

| | | |
|---|---|---|
| 7,011,715 B2 * | 3/2006 | Verhaverbeke ................ 134/33 |
| 7,017,281 B2 * | 3/2006 | Izumi .............................. 34/565 |
| 7,021,319 B2 * | 4/2006 | Verhaverbeke et al. ....... 134/1.3 |
| 2002/0121290 A1 * | 9/2002 | Tang et al. ........................ 134/6 |
| 2006/0070638 A1 * | 4/2006 | Aegerter et al. ................ 134/26 |
| 2007/0017555 A1 * | 1/2007 | Sekiguchi et al. .............. 134/33 |

FOREIGN PATENT DOCUMENTS

| | | |
|---|---|---|
| JP | 06-216105 | 8/1994 |
| JP | 2003-347267 | 12/2003 |
| JP | 2004-119854 A | 4/2004 |
| JP | 2006-332215 | 12/2006 |
| JP | 2007-227765 | 9/2007 |
| JP | 2007-317802 | 12/2007 |
| KR | 20-0177341 | 1/2000 |
| KR | 10-2000-0037982 A | 7/2000 |
| KR | 10-2005-0035318 A | 4/2005 |
| KR | 1020070062457 A | 6/2007 |
| TW | 504749 B | 10/2002 |
| TW | 200618098 A | 6/2006 |
| TW | 200625387 A | 7/2006 |

\* cited by examiner

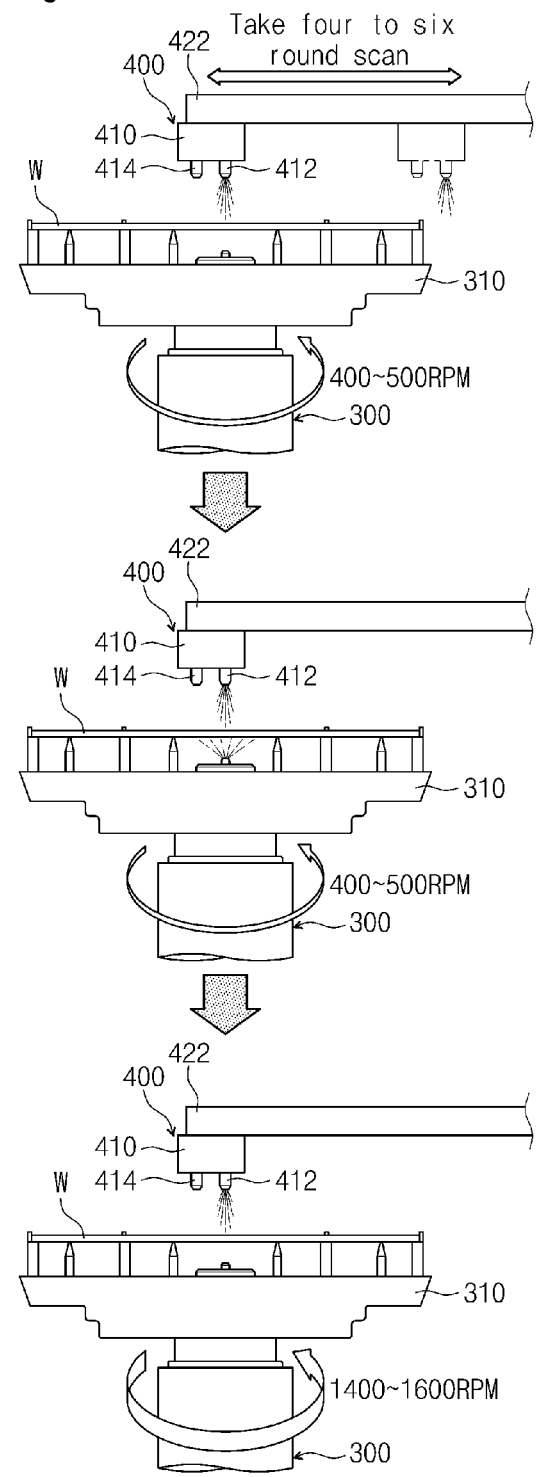

APPARATUS AND METHOD FOR DRYING SUBSTRATES

TECHNICAL FIELD

The present invention relates to apparatuses and methods for drying substrates. More specifically, the present invention relates to an apparatus and a method for drying substrates using isopropyl alcohol (IPA).

BACKGROUND ART

Semiconductor manufacturing processes include a wafer fabrication process. Generally, a wafer fabrication process includes a photoresist coating process, a developing and baking process, an etching process, a chemical vapor deposition process, an ashing process and so forth. In addition, a wet cleaning process is performed using chemicals or deionized water (DI water) to remove various contaminants attached to a surface of a substrate during these processes.

After a cleaning process is performed, a drying process is performed to dry chemicals or DI water remaining on the surface of the substrate. A spin dryer and an isopropyl alcohol (IPA) dryer are used as apparatuses for drying substrates. The spin dryer uses a mechanodynamical rotatory force to dry semiconductor substrates, and the IPA dryer uses a chemical reaction of IPA to dry semiconductor substrates.

A typical spin dryer uses the rotation operation of a spin head to dry substrates. Considering impurity particles with the trends toward higher integration density of semiconductor devices and larger diameter of substrates, the spin dryer cannot evade disadvantages such as watermarks formed on a dried semiconductor substrate.

For this reason, the IPA dryers are widely being used. As mentioned above, the IPA dryer uses a chemical reaction of IPA to dry substrates. That is, the IPA dryer vaporizes an IPA solution and substitutes DI water with the vaporized IPA solution to perform a drying process.

DISCLOSURE OF INVENTION

Technical Problem

Unfortunately, a conventional substrate drying apparatus suffers from problems set forth below.

When an IPA solution is vaporized, a surface temperature of a substrate is rapidly reduced to increase time required for performing a drying process. Thus, the consumed amount of IPA also increases. Moreover, watermarks may be formed or particles may be generated by lack of drying.

Technical Solution

Exemplary embodiments of the present invention are directed to methods for drying substrates. In an exemplary embodiment, the method may include: a pre-stage in which heated fluid is injected to a bottom surface of a substrate to raise a temperature of the substrate simultaneously to injection of an organic solvent to a top surface of a rotating substrate.

In this embodiment, the method further includes: a final stage in which the injection of the heated fluid is stopped and the organic solvent is injected to a top surface of the substrate.

In this embodiment, during the pre-stage and the final stage, a dry gas is injected with the organic solvent to improve a vaporization power of the organic solvent.

In this embodiment, a substrate rotation speed in the final stage is higher than that in the pre-stage.

In this embodiment, during the final stage, the organic solvent is injected from the center to the edge of the substrate only once.

In this embodiment, the pre-stage includes: a scan step in which scan injection of the organic solvent is conducted from the center to the edge of the substrate and from the edge to the center thereof; and a fixing step in which the organic solvent is fixedly injected at the center of the substrate, wherein the heated fluid is injected to the bottom surface of the substrate only in the fixing step.

In this embodiment, the method further include: a final stage in which the injection of the heated fluid is stopped and an organic solvent is injected only to the center of the top surface of the substrate.

In this embodiment, a substrate rotation speed in the final stage is higher than that in the pre-stage.

In this embodiment, a substrate rotation speed in the final stage is 1400 to 1600 rpm, and a temperature of the heated fluid injected to the bottom surface of the substrate is 60 to 80 degrees centigrade.

In this embodiment, in the pre-stage, the heated fluid is injected to the bottom surface of the substrate after fluid accumulated in a pipe is drained for a determined time.

In this embodiment, the heated fluid is deionized water (DI water), and the organic solvent is isopropyl alcohol (IPA).

In another exemplary embodiment, the method may include: a pre-stage in which heated fluid is injected to a bottom surface of a substrate to raise a temperature of the substrate simultaneously to injection of an organic solvent to a top surface of the substrate and injection of a dry gas to the top surface thereof to improve a vaporization power of the organic solvent; and a final stage in which the injection of the heated fluid is stopped and the organic solvent and the dry gas are injected to the top surface of the substrate.

In this embodiment, a substrate rotation speed in the final stage is 600 to 800 rpm which is higher than that in the pre-stage, and the organic solvent is injected from the center to the edge of the substrate only once.

In another exemplary embodiment, the method may include: a pre-stage in which after scan injection of an organic solvent is conducted from the center to the edge of a substrate and from the edge to the center thereof, heated fluid is injected to a bottom surface of the substrate to raise a temperature of the substrate simultaneously to fixedly injection of the organic solvent at the center of the substrate; and a final stage in which the injection of the heated fluid is stopped and the organic solvent is injected only at the center of the top surface of the substrate.

In this embodiment, a substrate rotation speed in the final stage is 1400 to 1600 rpm which is higher than that in the pre-stage.

Exemplary embodiments of the present invention are directed to an apparatus for drying substrates. In an exemplary embodiment, the apparatus may include: a support unit including a spin head on which a substrate is loaded; a bowl adapted to accommodate the spin head of the support unit and provide a space where a process is performed; an upper nozzle part configured to supply a dry fluid to a top surface of the substrate loaded on the spin head; a lower nozzle part installed at a top surface of the spin head and configured to inject heated fluid to the bottom surface of the substrate; a first fluid supply part configured to supply heated fluid to the lower nozzle part; and a heater installed at the first fluid supply part and configured to heat fluid to be supplied to the lower nozzle part.

In this embodiment, the upper nozzle part includes: a first nozzle configured to inject an organic solvent to dry a top surface of a substrate; and a second nozzle configured to inject a dry gas to improve a vaporization power of the organic solvent.

In this embodiment, the apparatus further includes: a moving part configured to moving the upper nozzle part such that the upper nozzle part injects fluid while moving from the center to the edge of a top surface of the substrate.

In this embodiment, the heater heats deionized water (DI water) at a temperature ranging from 60 to 80 degrees centigrade.

Advantageous Effects

According to the present invention, there are advantages and effects set forth below.

Firstly, DI water of a regular temperature is supplied to a bottom surface of a substrate to prevent a temperature of a substrate surface from increasing rapidly and suppress generation of particles resulting from watermarks or lack of drying.

Secondly, a temperature of a substrate is regularly maintained during a drying process to reduce time required for the drying process and the consumed amount of an IPA solution.

Thirdly, while a substrate rotates at a high speed, an IPA solution is injected at the center of a substrate to reduce the amount of a dry gas used. Further, a rebound phenomenon of the IPA solution is suppressed to reduce particles.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

BRIEF DESCRIPTION OF THE DRAWINGS

FIG. 7 illustrates steps of the drying method according to the second embodiment of the present invention.

BEST MODE FOR CARRYING OUT THE INVENTION

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
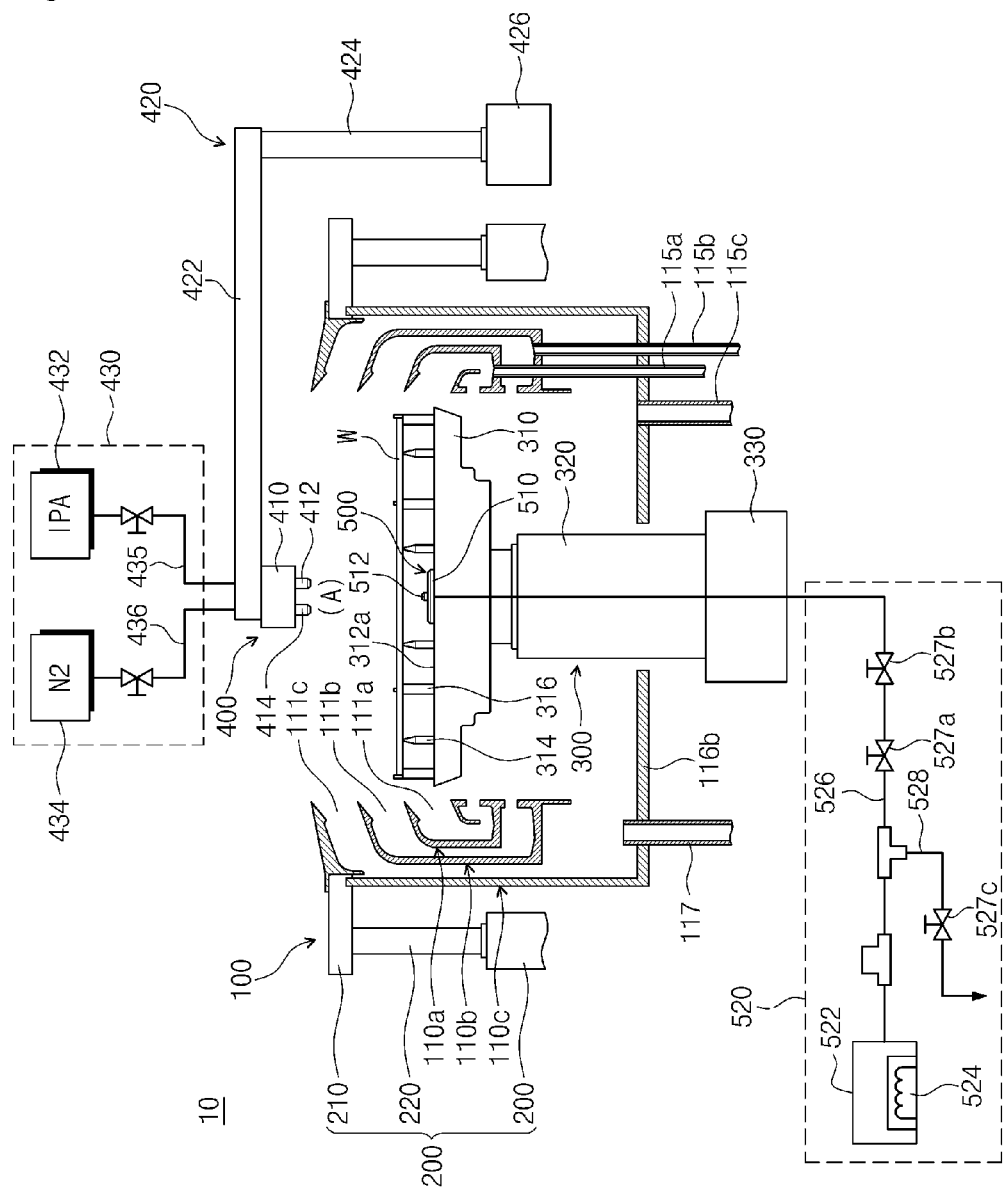
FIG. 1 is a cross-sectional view of a substrate drying apparatus using IPA according to an embodiment of the present invention.

FIG. 1 shows a substrate drying apparatus 10 using IPA according to an embodiment of the present invention.

The substrate drying apparatus 10 includes a bowl 100, a lift unit 200, a support unit 300, an upper nozzle part 400, and a lower nozzle part 500.

<Bowl>

As shown in FIG. 1, the bowl 100 has an open top and is configured to surround a spin head 310. Also the bowl 100 collects and discharge treatment fluid dispersed over a rotating substrate. A rinsing nozzle, fixed to the bowl 100 to inject deionized water (DI water) to a substrate, etc. is omitted for the convenience of drawing this figure. The bowl 100 may have a variety of shapes and be a one-stage bowl.

In the bowl 100, annular ducts are arranged on multi-stages to intake or suck treatment fluid dispersed on a substrate. More specifically, a top-open space "A" is defined inside the bowl 100. In the space "A", a substrate W is treated and the spin head 310 is disposed. A spindle 320 is fixedly coupled with the bottom of the spin head 310 to support and rotate the spin head 320. The spindle 320 protrudes to the exterior of the bowl 100 through an opening formed at the bottom surface of the bowl 100. A rotation member 330, such as a motor, is coupled with the spindle 320 to provide a rotation force. The bowl 110 is configured to separate and recover chemicals used in a process, which makes it possible to reuse the chemicals. The bowl 100 includes a plurality of recovery containers 110a, 110b, and 110c in which different kinds of treatment solutions used in a process are recovered, respectively. In this embodiment, the bowl 100 includes three recovery containers, which are named an inner recovery container 110a, an intermediate recovery container 110b, and an outer recovery container 110c, respectively.

The inner recovery container 110a is provided with a ring shape to surround the spin head 310, and the intermediate recovery container 110b is provided with a ring shape to surround the inner recovery container 110a. The outer recovery container 110c is provided with a ring shape to surround the intermediate recovery container 110b. The recovery containers 110a, 110b, and 110c have inlets 111a, 111b, and 111c communicating with the space "A" defined inside the bowl 110, respectively. Each of the inlets 111a, 111b, and 111c is provided at the circumference of the spin head 310 with a ring shape. The chemicals injected to the substrate W to be used in the process flows into the recovery containers 110a, 110b, and 110c through the inlets 111a, 111b, and 111c by a centrifugal force caused by rotation of the substrate W. The chemicals flowing into the recovery containers 110a, 110b, and 110c are drained to the outside through their drain lines 115a, 115b, and 115c.

<Lift Unit>

The lift unit 200 allows the bowl 100 to straightly move up and down. Due to the up-and-down movement of the bowl 100, a relative height of the bowl 100 to the spin head 310 is altered. The lift unit 200 includes a bracket 210, a movable shaft 220, and a driver 230. The bracket 210 is fixedly installed at the outer wall of the bowl 100. The movable shaft 220 is fixedly coupled with the bracket 210 and raised and lowered by means of the driver 230. When a substrate W is loaded on the spin head 310 or unloaded therefrom, the bowl 100 is lowered to protrude the spin head 310 over the bowl 100. While a process is carried out, a height of the bowl 100 is adjusted to enable a treatment solution supplied to a substrate W to flow into preset recovery containers 110a, 110b, and 110c according to the kind of the treatment solution. The contrary to the above-stated method, the lift unit 200 allows the spin head 310 to move up and down.

<Support Unit>

The support unit 300 is configured to support a substrate W during a treatment process and includes the spin head 310, the spindle 320, and a rotation member 330.

The spin head 310 is disposed at the inner space defined inside the bowl 100. The spin head 310 includes a top surface 312a on which a substrate W is loaded, support pins 314 to support the substrate W while being spaced apart from the top surface 312a of the spin head 310, and chucking pins 316 to chuck a portion of the edge of the substrate W when a process is carried out.

The spindle 320 is coupled with the central bottom of the spin head 310 and has a hollow-shaft shape to transmit a rotation force to the spin head 310. Although not illustrated in detail, the rotation member 330 may have a conventional structure including a driving part such as a motor to generate a rotation force, a belt to transmit the rotation force generated from the driver to a spindle, and a power transmission part such as a chain.

<Lower Nozzle Part>

The lower nozzle part 500 is configured to inject heated fluid to a bottom surface of a substrate W. The heated fluid is heated deionized water (DI water) and may be heated nitrogen gas or the like.

The lower nozzle part 500 includes a lower nozzle 510 installed at the center of the top surface of the spin head 310. The lower nozzle 510 is connected to a DI water supply line to be disposed at the center of the spin head 310. The lower nozzle 510 includes a heating injection hole 512 provided to inject the heated DI water to a bottom surface of a substrate. The substrate is heated by the heated DI water injected through the heating injection hole 512. The heated DI water, injected to the center of the bottom surface of the substrate through the lower nozzle 510, is easily injected to the edge of the substrate due to the rotation of the substrate to uniformly raise a temperature of the substrate.

A first fluid supply part 520 includes a DI water supply source 522, a heater 524, a DI water supply line 526, and a drain line 528. The heater 524 heats the DI water stored in the DI water supply source 522 to a temperature ranging from 60 to 80 degrees centigrade. The DI water supply line 526 has one end connected to the DI water supply source 522 and the other end connected to the lower nozzle 510. The DI water supply line 526 functions as a flow path of the heated DI water passing a hollow section of the spindle 320. The drain line 528 branches from the DI water supply line 526. A first valve 527a functioning as an on/off valve and a suckback valve 527b are installed at the DI water supply line 526, and a second valve 527c functioning as an on/off valve is installed at the drain line 528. The suckback valve 527b allows the heated DI water remaining in a nozzle to flow backward shortly after discharging the heated DI water. The DI water supply line 526 includes a predetermined pipe. Also the DI water supply line 526 may be defined as a pipe-type (hollow) space inside the spindle 320. The drain line 528 is adapted to achieve process reproducibility of the heated DI water injected to the bottom surface of the substrate. A temperature of the heated DI water accumulated on the DI water supply line 526 decreases with the lapse of time. For this reason, the DI water accumulated on the DI water supply line 526 is drained through the drain line 528 by closing the first valve 527a and opening the second valve 527c in order not to be injected to the bottom surface of the substrate through the lower nozzle 510. That is, the DI water accumulated on the DI water supply line 526 is drained for a determined time before supplying the heated DI water to the bottom surface of the substrate. Afterwards, the DI water heated by the heater 524 is supplied to the lower nozzle 510.

The heated DI water serves to prevent a surface temperature of a substrate W from rapidly decreasing with condensation cooling caused by vaporization of an isopropyl alcohol (IPA) solution when a process of drying the substrate W is carried out. That is, while the IPA solution and an $N_2$ gas are injected to a surface of the substrate W to dry the substrate W, the heated DI water is injected to a bottom surface of the substrate W to maintain the entire temperature of the substrate W at a temperature between 60 and 80 degrees centigrade. Although a temperature of the heated DI water is 60 to 80 degrees centigrade, it may vary with a proceeding state of the drying process.

Due to the heated DI water, the temperature of the substrate W may be maintained regularly during the drying process to prevent generation of particles caused by watermarks and lack of drying. Moreover, the entire substrate W is regularly maintained without rapid decrease in temperature to reduce time required for performing a drying process using an IPA solution. Thus, the consumed amount of the IPA solution decreases.

Although not shown in the figure, the lower nozzle 510 may further include a rinsing injection hole provided to inject a rinsing solution (e.g., DI water) during a rinsing process and a drying injection hole provided to inject IPA vapor or dry gas (e.g., nitrogen gas) during a substrate drying process.

<Upper Nozzle Part>

The upper nozzle part 400 includes a plurality of nozzles configured to treat a substrate W loaded on the spin head 310. The upper nozzle part 400 injects an organic solvent, a dry gas, etc. to a top surface (to-be-treated surface) of a substrate W loaded on the spin head 310.

While traveling from the center to the edge of a substrate W and vice versa or at the center of the substrate W, the upper nozzle part 400 injects an organic solvent or a dry gas to the surface of the substrate W. The upper nozzle part 400 is connected to a moving part 420, described later, to be movable.

The upper nozzle part 400 includes a plurality of nozzles 412 and 414 and an injection head 410 where the plurality of nozzles 412 and 414 are installed. The injection head 410 is connected to an arm 422 of the moving part 420. The plurality of nozzles 412 and 414 are installed at a surface of the injection head 410 facing the substrate W, and include a first nozzle 412 and a second nozzle 414 injecting different fluids. Specifically, the injection head 410 includes the first nozzle 412 configured to inject an IPA solution and the second nozzle 414 configured to inject N2 gas.

Isopropyl alcohol (IPA) is a chemical used to dry a substrate W using its volatility. While passing the surface of the substrate W, the IPA solution makes a substitution reaction with hydrogen of the DI water remaining at the surface of the substrate W after a cleaning process to remove moisture from the remaining DI water. The $N_2$ gas serves to activate vaporization (vaporization power) of the IPA solution. That is, the $N_2$ gas increases a vaporization temperature of the IPA solution to enhance a drying effect of the substrate W. Further, it is possible to prevent a temperature of the IPA solution from decreasing with $N_2$ gas of a normal temperature.

The upper nozzle part 400 may further include a nozzle configured to inject an etchant such as hydrofluoric acid (HF) solution for etching and a nozzle configured to inject DI water for cleaning. In another embodiment, another upper nozzle part may be provided with a nozzle configured to inject an etchant or a nozzle configured to inject DI water for cleaning.

Although two nozzles are provided in this embodiment, three or more nozzles may be provided according to the kind of fluids required in a substrate treating process.

A second fluid supply part 430 supplies various fluids for a drying process to the injection head 410. The second fluid supply part 430 includes an IPA supply source 432, a nitrogen gas supply source 434, a first supply line 435 to connect the IPA supply source 432 with the first nozzle 412, and a second supply line 436 to connect the nitrogen gas supply source 434 with the second nozzle 414.

For example, the upper nozzle part 400 may be configured to sequentially inject fluids for etching, cleaning, and drying to the surface of the substrate W to sequentially remove oxide and contaminants, clean and dry the substrate W. Accordingly, if necessary, the top nozzle part 400 may include a plurality of nozzles.

The moving part 420 moves the upper nozzle part 400 to uniformly inject the fluid, injected from the upper nozzle part 400, to the edge from the center of the substrate W. The moving part 420 includes an arm 422, a support shaft 424, and a driving motor 426. The injection head 410 is connected to one end of the arm 422 to support the injection head 410, and the support shaft 424 is connected to the other end of the arm 422. The support shaft 424 receives a rotation force from the driving motor 426 and moves the injection head 410 connected to the arm 422 by means of the received rotation force. The driving motor is connected to a controller (not shown).

There are two methods of moving the top nozzle part 400 by means of the moving part 420. One is a straight-line movement method, and the other is a rotation movement method. These two methods may be used individually or together.

Figure 2:
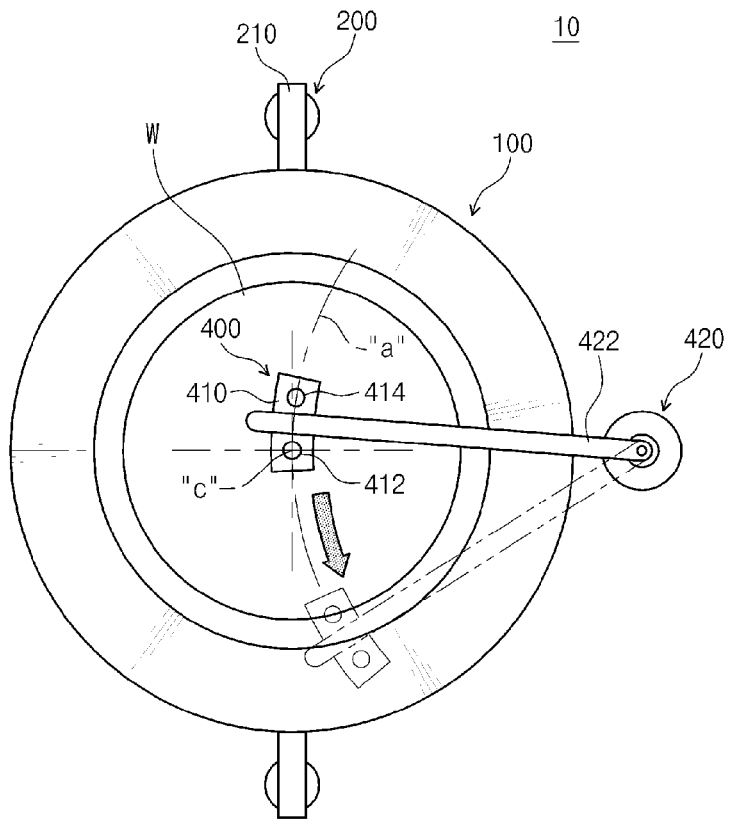
FIG. 2 shows an upper nozzle part operating in rotation movement.

As shown in FIG. 2, an upper nozzle part 400 may rotationally move on a support shaft 424. At this point, the upper nozzle part 400 draws an arc "a" passing the center "c" of a substrate W, and first and second nozzles 412 and 414 are disposed on the arc "a" In the moving direction (arrow direction) of the upper nozzle part 400, the first nozzle 412 may be disposed ahead of the second nozzle 414, i.e., the second nozzle 414 may be disposed behind the first nozzle 412.

Figure 3:
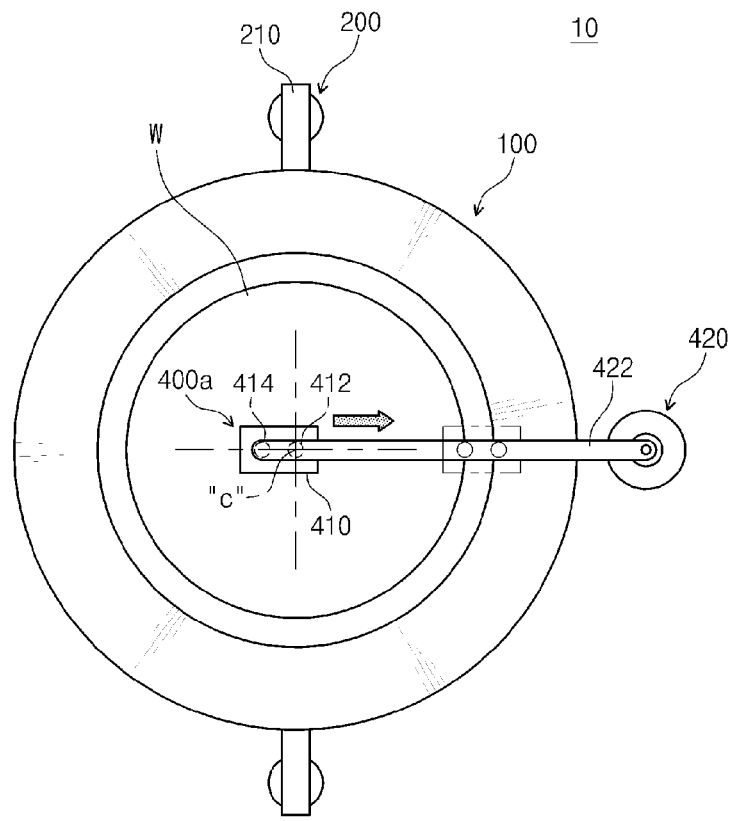
FIG. 3 shows an upper nozzle part operating in straight line movement.

As shown in FIG. 3, an upper nozzle part 400a may straightly move over an arm 422 of a moving part 420. At this point, the upper nozzle part 400a is disposed on a straight line passing the center "c" of a substrate. In the moving direction (arrow direction) of the upper nozzle part 400a, the first nozzle 412 may be disposed ahead of the second nozzle 414, i.e., the second nozzle 414 may be disposed behind the first nozzle 412.

As shown in FIGS. 2 and 3, the first nozzle 412 and the second nozzle 414 are disposed in a row in a moving direction of the upper nozzle part 400 or relative to a tangent line of the moving direction thereof. Thus, although any one of the foregoing two methods is used, the second nozzle 414 injects $N_2$ gas while moving along the track of the first nozzle 412 during the injection of an IPA solution from the first nozzle 412.

The effect of the above-structured substrate drying apparatus using IPA will now be described below.

First, a substrate W is transferred to be loaded on a spin head 310. The loaded substrate W is held by a chucking pin 316 and a rotation member 330 rotates the spin head 310.

If the substrate W rotates, an etching process is performed using an etchant. Generally, hydrofluoric acid (HF) solution is used as an etchant for etching a silicon layer on a substrate during a wet etching process. The HF solution is injected into a process chamber to etch a silicon layer on a surface of a rotating substrate W. An injection hole formed to inject an etchant may be provided at an upper nozzle part 400 or another nozzle except the upper nozzle part 400.

After the etching process is performed, etching residues on the surface of the substrate W are removed. While a substrate W continues to rotate, DI water is injected to clean or rinse the substrate W. An injection hole formed to inject cleaning DI water is provided at the upper nozzle part 400 or another nozzle except the upper nozzle part 400.

After the cleaning process is completed, a drying process is performed to dry a surface of a substrate W.

Figure 4:
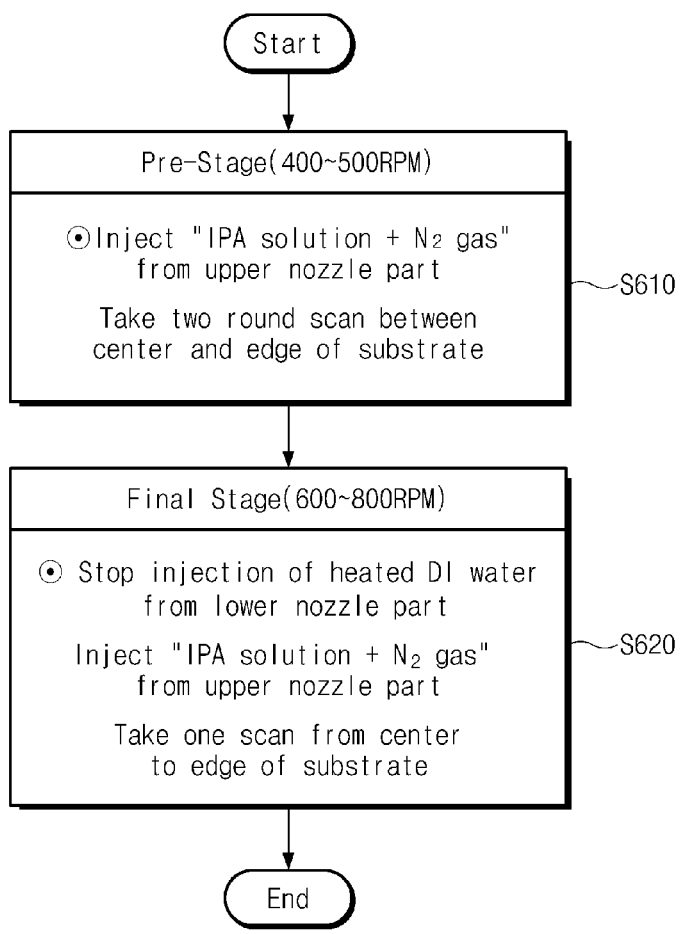
FIG. 4 is a flowchart illustrating a drying method according to a first embodiment of the present invention.
Figure 5:
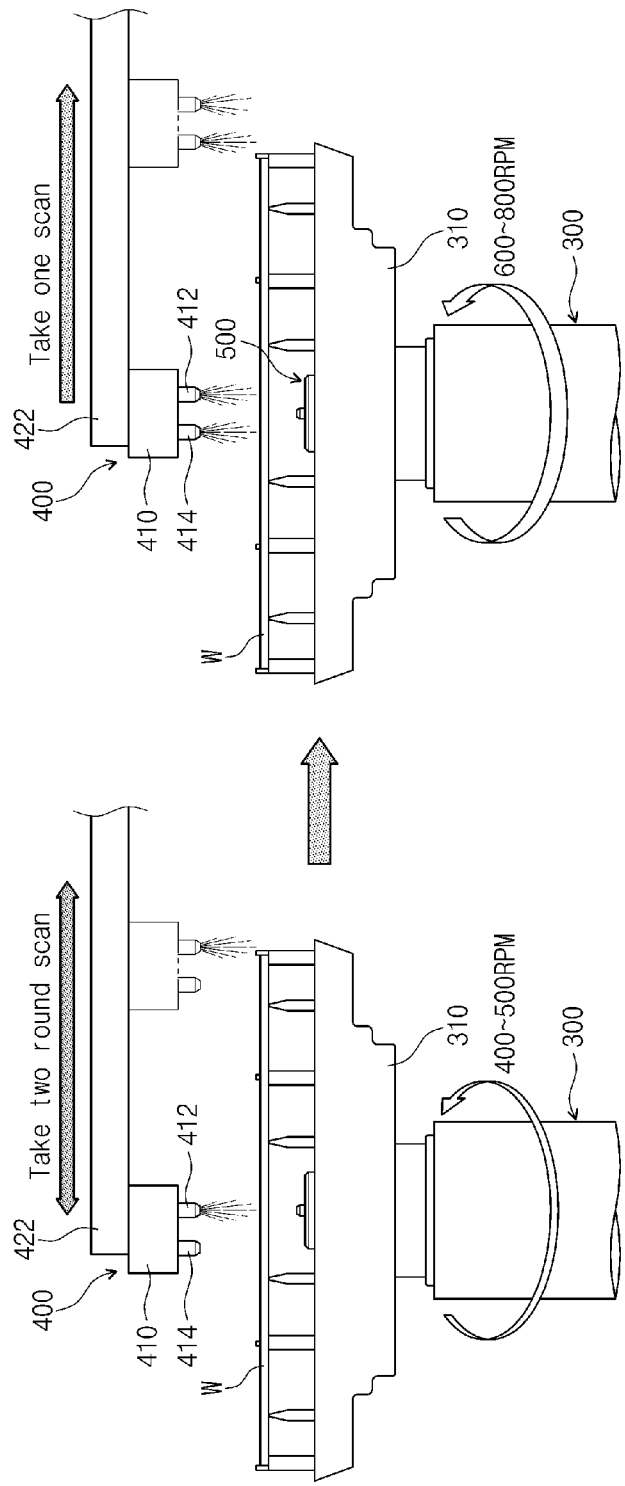
FIG. 5 illustrates steps of the drying method according to the first embodiment of the present invention.

FIG. 4 is a flowchart illustrating a drying method according to a first embodiment of the present invention, and FIG. 5 illustrates steps of the drying method according to the first embodiment of the present invention.

As illustrated in FIGS. 4 and 5, a drying process may include a pre-stage S610 and a final stage S620. A substrate rotation speed in the pre-stage S610 is 400 to 500 rpm, which is lower than that in the final stage S620 (600 to 800 rpm).

In the pre-stage S610, heated DI water is injected from a lower nozzle part 500 simultaneously to injection of an IPA solution and $N_2$ gas from an upper nozzle part 400. The upper nozzle part 400 injects the IPA solution and $N_2$ gas while taking a round scan between the center and the edge of a substrate surface. The IPA solution is injected to dry a substrate W using volatility of the IPA solution. While passing the surface of the substrate W, the IPA solution makes a substitution reaction with hydrogen of the DI water remaining at the surface of the substrate W after a cleaning process to remove moisture from the remaining DI water. During the drying process using the IPA solution, a second nozzle 414 of the upper nozzle part 400 injects the $N_2$ gas while moving along the track of a first nozzle 412 to dry the surface of the substrate W. The $N_2$ gas serves to activate vaporization of the IPA solution.

As described above, while the surface of the substrate W is dried using the IPA solution and the $N_2$ gas, the lower nozzle part 500 injects heated DI water to a bottom surface of the substrate W. A temperature of the heated DI water is 60 to 80 degrees centigrade. The supply of the heated DI water makes a temperature distribution of the entire substrate W uniform, preventing formation of watermarks or generation of particles resulting from lack of drying. Moreover, the entire temperature of the substrate W is raised to make rapid drying (improvement of vaporization power) possible due to the IPA solution. Thus, drying time is reduced, i.e., the consumed amount of the IPA solution decreases.

In the final stage S620, the IPA solution and $N_2$ gas are injected to the top surface of the substrate W to dry the top surface thereof while rotating the substrate W at a higher speed than in the pre-stage S610 without injection of the heated DI water. The final stage S620 is completed by taking one scan from the center to the edge of the substrate W. Meanwhile, the final stage S620 may include a step of injecting $N_2$ gas to the bottom of the substrate W to remove DI water which may remain at the bottom thereof. Thus, the lower nozzle part 500 may have an injection hole (not shown) for injecting the $N_2$ gas to dry the remaining DI water.

After the drying process is completed, the rotation member 330 stops operating. Thus, rotation of the spin head 310 pauses and the substrate W is transferred or another process is performed.

Figure 6:
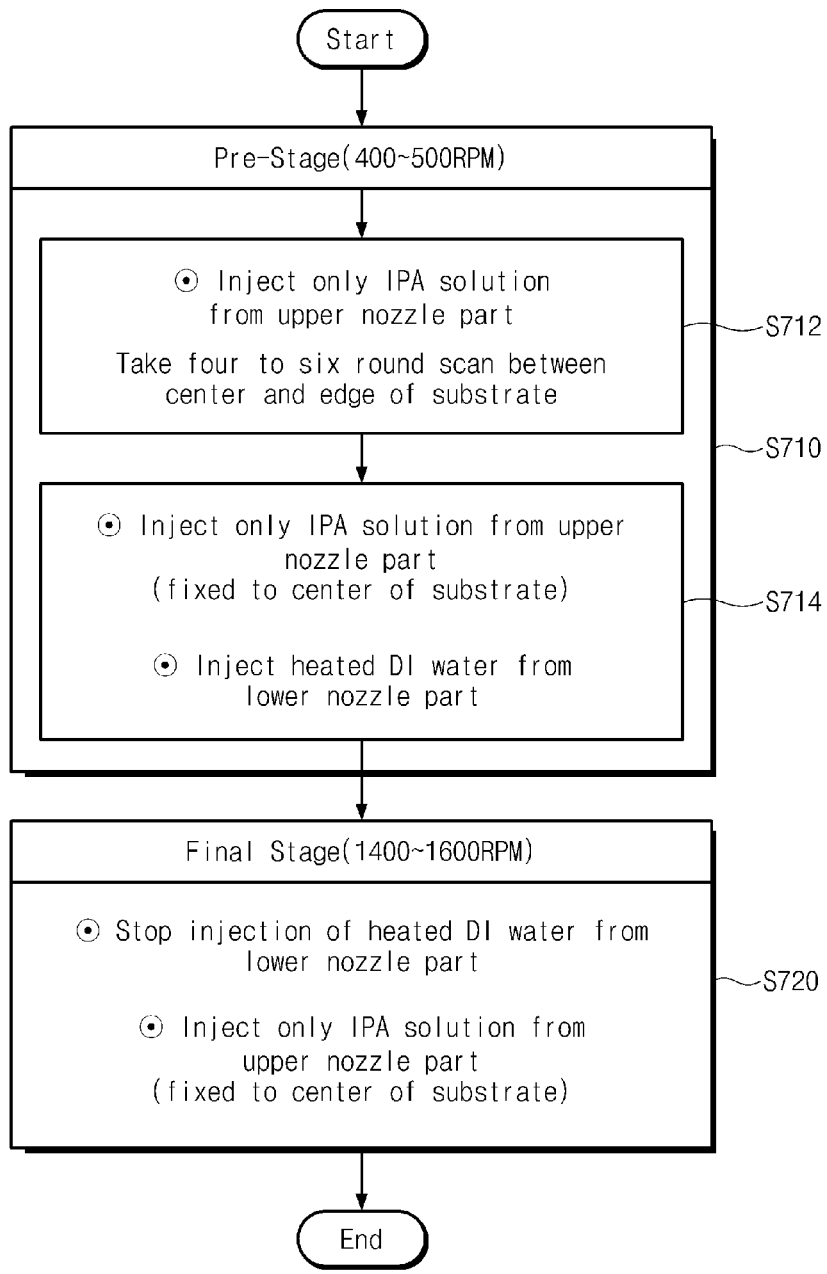
FIG. 6 is a flowchart illustrating a drying method according to a second embodiment of the present invention.

FIG. 6 is a flowchart illustrating a drying method according to a second embodiment of the present invention, and FIG. 7 illustrates steps of the drying method according to the second embodiment of the present invention.

As illustrated in FIGS. 6 and 7, a drying process may include a pre-stage S710 and a final stage S720. A substrate rotation speed in the pre-stage S710 is 400 to 500 rpm, which is lower than that in the final stage S710 (1400 to 1600 rpm).

The pre-stage S710 includes a first step S712 in which an upper nozzle part 400 injects an IPA solution to a top surface of a substrate while taking four to six round scan (from the center to the edge of the substrate) and a second step S714 in which a lower nozzle part 500 injects heated DI water simultaneously to injection of the IPA solution to the center of the top surface of the substrate while the upper nozzle part 400 is fixed to the center of the substrate.

That is, the upper nozzle part 400 injects the IPA solution while taking four to six round scan from the top surface to the edge of the substrate (taking 10-13 seconds). Thereafter, the upper nozzle part 400 injects IPA solution while being fixed to the center of the top surface of the substrate (taking 9-11 seconds). The lower nozzle part 500 injects heated DI water to the bottom of the substrate to heat the substrate only during the injection of the IPA solution while the upper nozzle part 400 is fixed to the center of the top surface of the substrate.

In the final stage S720, while the substrate rotates at a higher speed than in the pre-stage S710, the IPA solution is injected to the top surface of the substrate to dry the top surface thereof without injection of the heated DI water (taking 14-16 seconds). The final stage S720 is to inject the IPA solution while the upper nozzle part 400 is fixed to the center of the substrate. In the final stage S720, a centrifugal force caused by high-speed rotation of the substrate is replaced with dry gas effect without use of $N_2$ gas. Especially because the upper nozzle part 400 injects the IPA solution while being fixed to the center of the substrate, generation of particles resulting from a rebound phenomenon may be suppressed.

After the drying process is completed, the rotation member 330 stops operating. Thus, rotation of the spin head 310 pauses and the substrate W is transferred or another process is performed.

The substrate W is not limited to a wafer for use in fabrication of semiconductor chips and may be applied to all substrates corresponding to flat panel displays such as liquid crystal displays (LCDs), plasma display panels (PDPs), vacuum fluorescence displays (VFDs), field emission displays (FEDs) or electroluminescence displays (ELDs).

According to the present invention, there are advantages and effects set forth below.

Firstly, DI water of a regular temperature is supplied to a bottom surface of a substrate to prevent a temperature of a substrate surface from increasing rapidly and suppress generation of particles resulting from watermarks or lack of drying.

Secondly, a temperature of a substrate is regularly maintained during a drying process to reduce time required for the drying process and the consumed amount of an IPA solution.

Thirdly, while a substrate rotates at a high speed, an IPA solution is injected at the center of a substrate to reduce the amount of a dry gas used. Further, a rebound phenomenon of the IPA solution is suppressed to reduce particles.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

The invention claimed is:

1. A method for drying substrates, comprising:
injecting heated fluid to a bottom surface of a substrate to raise a temperature of the substrate in a pre-stage;
fixedly injecting an organic solvent to a top surface of the substrate, which is rotating, simultaneously with injecting the heated fluid, in the pre-stage;
wherein the pre-stage includes scanning injection of the organic solvent from a center to an edge of the substrate and from the edge to the center of the substrate before fixedly injecting the organic solvent to the top surface of the substrate, and
wherein the heated fluid is injected to the bottom surface of the substrate only when the organic solvent is fixedly injected.

2. The method of claim 1, further comprising:
stopping the injection of the heated fluid in a final stage; and
injecting the organic solvent to the top surface of the substrate in the final stage.

3. The method of claim 2, wherein, during the pre-stage and the final stage, a dry gas is injected with the organic solvent to improve a vaporization power of the organic solvent.

4. The method of claim 2, wherein a rotation speed of the substrate in the final stage is higher than a rotation speed of the substrate in the pre-stage.

5. The method of claim 2, wherein, during the final stage, the organic solvent is injected from the center to the edge of the substrate only once.

6. The method of claim 1, further comprising:
stopping the injection of the heated fluid in a final stage; and
injecting an organic solvent only to the center of the top surface of the substrate in the final stage.

7. The method of claim 6, wherein a rotation speed of the substrate in the final stage is higher than a rotation speed of the substrate in the pre-stage.

8. The method of claim 1, wherein a rotation speed of the substrate in the final stage is 1400 to 1600 rotations per minute.

9. The method of claim 1, wherein a temperature of the heated fluid injected to the bottom surface of the substrate is 60 to 80 degrees centigrade.

10. The method of claim 1, wherein, in the pre-stage, the heated fluid is injected to the bottom surface of the substrate after the heated fluid accumulated in a pipe is drained for a determined time.

11. The method of claim 1, wherein the heated fluid is deionized water (DI water), and the organic solvent is isopropyl alcohol (IPA).

12. A method for drying substrates, comprising:
injecting heated fluid to a bottom surface of a substrate to raise a temperature of the substrate in a pre-stage;
fixedly injecting an organic solvent to a top surface of the substrate simultaneously with injecting the heated fluid in the pre-stage;
injecting a dry gas to the top surface of the substrate to improve a vaporization power of the organic solvent in the pre-stage;
stopping the injection of the heated fluid in a final stage; and
injecting the organic solvent and the dry gas to the top surface of the substrate in the final stage,
wherein the pre-stage includes scanning injection of the organic solvent from a center to an edge of the substrate and from the edge to the center of the substrate before fixedly injecting the organic solvent at the center of the substrate, and
wherein the heated fluid is injected to the bottom surface of the substrate only when the organic solvent is fixedly injected.

13. The method of claim 12,
wherein a rotation speed of the substrate in the final stage is 600 to 800 rotations per minute which is higher than a rotation speed of the substrate in the pre-stage, and
wherein the organic solvent is injected from the center to the edge of the substrate only once in the final stage.

14. The method of claim 12, wherein a rotation speed of the substrate in the final stage is 600 to 800 rotations per minute which is higher than a rotation speed of the substrate in the pre-stage.

15. A method for drying substrates, comprising:
scanning injection of an organic solvent from the center to the edge of a substrate and from the edge to the center of the substrate;
injecting heated fluid to a bottom surface of the substrate to raise a temperature of the substrate in a pre-stage after scanning the injection of the organic solvent;
fixedly injecting the organic solvent at the center of the substrate simultaneously with injecting the heated fluid in the pre-stage;
stopping the injection of the heated fluid in a final stage; and
injecting the organic solvent only at the center of the top surface of the substrate in the final stage.

16. The method of claim 15, wherein a rotation speed of the substrate in the final stage is 1400 to 1600 rotations per minute which is higher than a rotation speed of the substrate in the pre-stage.

* * * * *